United States Patent [19]

Carter

[11] 4,163,239
[45] Jul. 31, 1979

[54] SECOND LEVEL PHASE LINES FOR CCD LINE IMAGER

[75] Inventor: David L. Carter, Upper Montclair, N.J.

[73] Assignee: Texas Instruments Incorporated, Dallas, Tex.

[21] Appl. No.: 756,505

[22] Filed: Jan. 3, 1977

Related U.S. Application Data

[60] Continuation of Ser. No. 524,437, Nov. 18, 1974, abandoned, which is a division of Ser. No. 414,484, Nov. 9, 1973, Pat. No. 3,869,572, which is a continuation of Ser. No. 214,365, Dec. 30, 1971, abandoned.

[51] Int. Cl.² ............... H01L 27/04; H01L 29/78; G11C 19/28
[52] U.S. Cl. .................. 357/24; 307/221 D; 357/30; 357/71
[58] Field of Search ............ 357/24, 30, 71; 307/221 D

[56] References Cited

U.S. PATENT DOCUMENTS

| Re. 27,951 | 3/1974 | Teer et al. | 357/24 |
| 3,651,349 | 3/1972 | Kahng et al. | 357/24 |
| 3,756,924 | 9/1973 | Collins et al. | 357/24 |
| 3,795,847 | 3/1974 | Engeler et al. | 357/24 |
| 3,858,232 | 12/1974 | Boyle et al. | 357/24 |

*Primary Examiner*—William D. Larkins
*Attorney, Agent, or Firm*—Melvin Sharp; Richard L. Donaldson; William E. Hiller

[57] ABSTRACT

Disclosed is an improved charge coupled optical imager and method of fabrication which includes a multilayer metallization system for addressing respective rows of the imager and for applying multiphase clocks to the respective electrodes of the charge coupled devices. The imager requires only two clock sources and substantially reduces the required semiconductor surface area required for a resolution element. In a preferred embodiment, anodized aluminum is used as the insulation separating the first and second levels of metallization.

5 Claims, 4 Drawing Figures

SECOND LEVEL PHASE LINES FOR CCD LINE IMAGER

This is a continuation of application Ser. No. 524,437, filed Nov. 18, 1974, now abandoned, which was a division of Ser. No. 414,484, Nov. 9, 1973, now U.S. Pat. No. 3,869,572, which was a continuation of Ser. No. 214,365, filed Dec. 30, 1971, now abandoned.

The present invention pertains to optical imagers in general and more particularly to an improved charge coupled optical imager which includes a multilevel metallization system for addressing the imager, and method of fabrication.

Charge-coupled devices are metal-insulator-semiconductor devices which belong to a general class of semiconductor charge devices which store and transfer information in the form of electrical charge. The charge coupled devices are distinguished by the property that the semiconductor portion of the devices is, for the most part, homogeneously doped, regions of different conductivity being required only for injecting or extracting charge. A typical semiconductor charge-coupled device shift register is described, for example, in Boyle, et al, Bell System Technical Journal 49, 587 (1970). In the shift register, a DC bias sufficient to invert the semiconductor surface is applied between electrodes, and the semiconductor material, and clocking pulses are applied sequentially to the electrodes. Because of the inversion, semiconductor surface minority carriers are drawn to the semiconductor-insulator interface and tend to collect in the potential wells under the electrodes. When the clocking pulses are sufficiently large, the minority carriers migrate from the area under one electrode to the area under the next following a potential well produced by the clocking pulses.

The charge coupled devices may advantageously be utilized as an optical imager. Bertram, "Application of the Charge Coupled Device Concept to Solid State Image Sensors" 1971 IEEE International Convention, Mar. 22–25, New York, N.Y., describes such a charge coupled imager which includes an optical integration section and a separate storage section. For cameras having a large number of picture elements, an excessive amount of surface area of semiconductor material is required due to the separate sections of the camera. Also, a large area camera requires a relatively fast clock rate which reduces the charge transfer efficiency.

Accordingly, an object of the present invention is to produce an improved charge-coupled imager.

A further object of the invention is to provide a charge-coupled imager having multilevel metallization system for addressing the imager.

An additional object of the invention is the provision of a method for fabricating the screen of an optical imager utilizing multilevel metallization techniques.

Briefly in accordance with the present invention, a compact optical imager is formed on a semiconductor substrate. A relatively thin insulating layer is formed over one surface of the substrate, and a first metallization layer is defined over the thin insulating layer. The metallization layer is patterned to define a plurality of substantially parallel, spaced apart electrodes which in combination with the semiconductor material and the thin insulating layer define a charge-coupled shift register. A second relatively thick insulating layer is formed over the first metallization, and a plurality of apertures are opened through this insulating layer to selectively expose electrodes of the charge-coupled shift register. A second level of metallization is then formed to define a plurality of substantially parallel conductive strips which selectively extend through the apertures to ohmically contact the electrodes. These conductive strips are the contact leads for the multiphase clocks required to operate the shift register. This multilevel metallization technique advantageously reduces the amount of semiconductor surface area required for the optical imager.

In accordance with an illustrative embodiment of the invention, a charge-coupled imager system comprises a plurality of rows of optically active, substantially parallel charge-coupled shift registers defined over one surface of a semiconductor substrate. The shift registers respectively comprise a multilevel metallization system. Switching means are included for coupling the conductive strips which ohmically contact respective electrodes of the shift register to a multiphase clock source. Scan means are operably connected to the switching means for selectively addressing respective rows of the optically active charge coupled registers. Output means are provided for detecting the electrical charge resulting from the image detected by the respective bits of the charge coupled shift register.

In accordance with a different aspect of the invention, a method is provided for fabricating an imager screen which includes the steps of forming a relatively thin insulating layer over one surface of a semiconductor substrate; forming a first layer of metal over the insulating layer and patterning this layer to define a plurality of spaced apart, elongated substantially parallel electrodes. A second relatively thick insulating layer is then formed over the electrodes. Apertures are opened through the second insulating layer to selectively expose the electrodes, and then a second layer of metal is formed over the second insulating layer. The second layer of metal extends through the apertures and ohmically contact the electrodes. The second layer of metal is then patterned to form a plurality of substantially parallel strips which extend substantially orthogonal to the elongated electrodes.

In accordance with a particular feature of the invention, the insulating layer separating the two levels of metallization comprises anodized aluminum.

Other objects, advantages and novel features of the present invention will become apparent upon reading the following detailed description of illustrative embodiments of the invention in conjunction with the drawings wherein.

Figure 1:
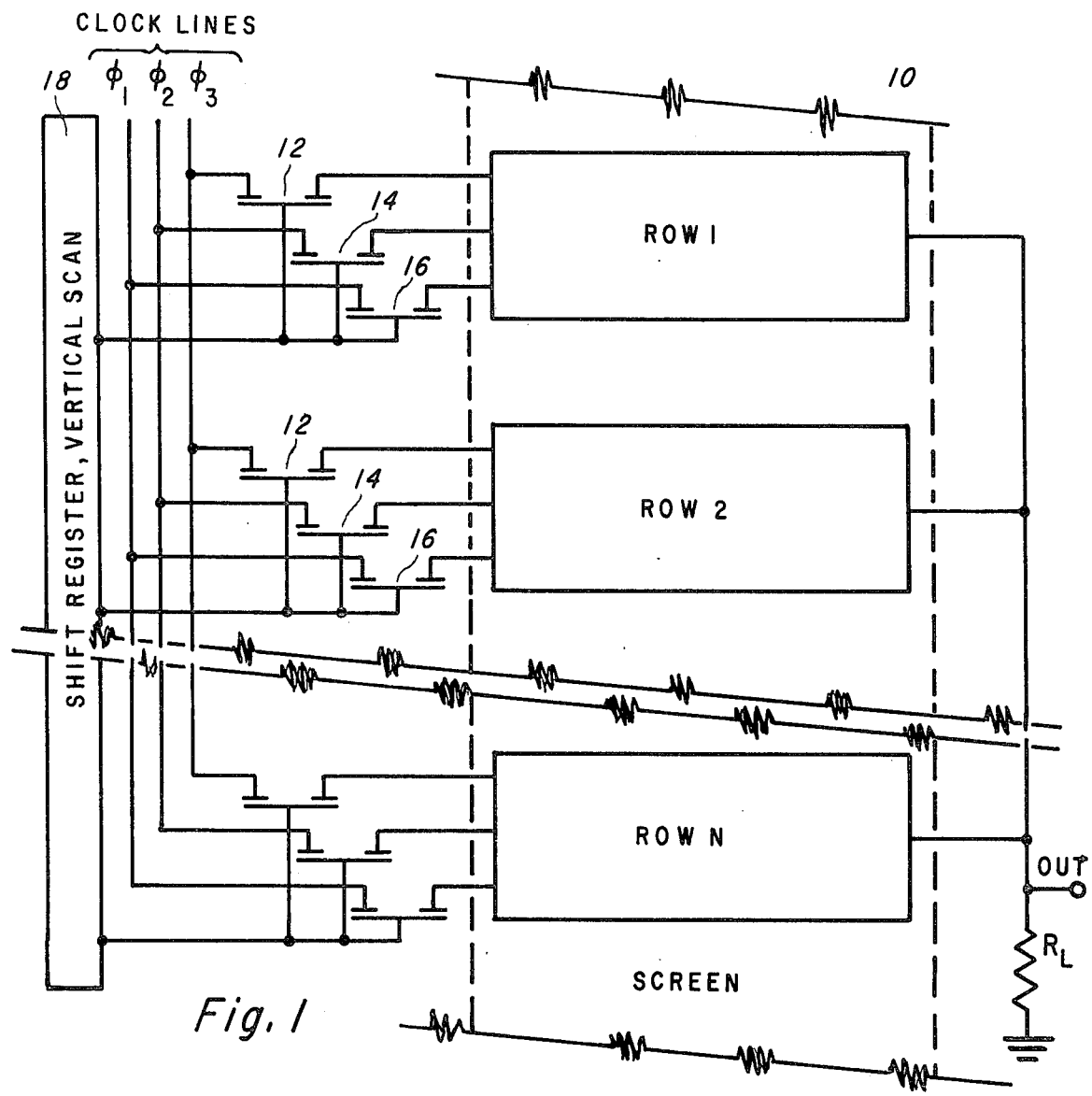
FIG. 1 is a schematic and block diagram illustration of an imager system in accordance with the present invention.
Figure 3:
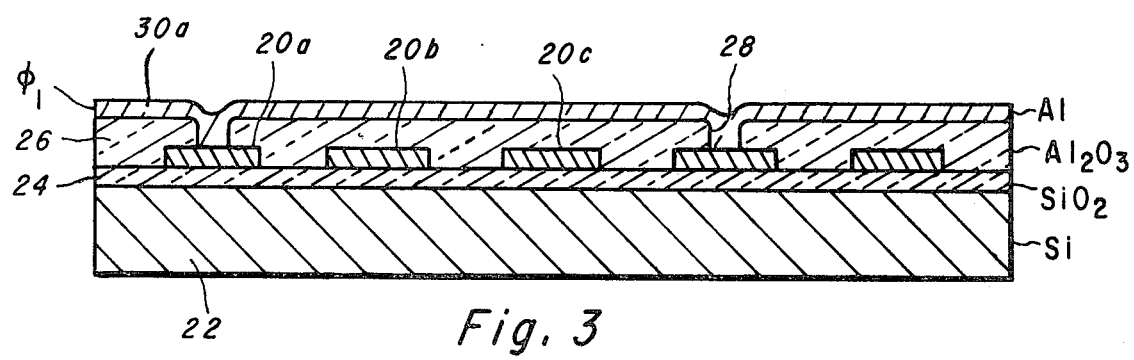
FIG. 3 is a cross section view along the line 3—3 of FIG. 2.

With reference to FIG. 1 there is illustrated an optical imager system in accordance with illustrative embodiment of the present invention. The imager system includes an optically active region or screen 10. This screen is comprised of a plurality of optically active regions disposed in horizontal rows labeled row 1, row 2 . . . row n. As will be explained in greater detail hereinafter, each row of the screen 10 comprises a multiphase charge coupled shift register. A two level metallization system is advantageously utilized to minimize surface area of semiconductor material required for the screen 10. Output means labeled $R_L$ are coupled to each row of the imager screen 10. As understood by those skilled in the art, the output of a charge coupled shift register may be detected through ohmic contact to a p-n junction region (not shown) formed in the surface region of the substrate.

A three-phase, charge-coupled shift register embodiment is illustrated in FIG. 1 and the multiphase clocks $\phi_1$, $\phi_2$ and $\phi_3$ are coupled to respective rows of the imager's screen 10 via insulated gate field effect transistor switching devices illustrated generally at 12, 14 and 16. Transistor 16 couples $\phi_1$ of the clocks to the charge coupled shift register while transistors 14 and 12 respectively couple clocks $\phi_2$ and $\phi_3$. The switching transistors 12, 14, and 16 are energized by vertical scan means shown in block diagram at 18. When it is desired to read information, for example, from row 1, the vertical scan means 18 provides a signal to the gates of transistor 12, 14 and 16, driving these transistors into conduction and enabling clock pulses $\phi_1$, $\phi_2$ and $\phi_3$ to be applied to the charge coupled shift register defining row 1 of the imager. In accordance with the preferred embodiment of the present invention, the vertical scan means comprises a bucket-brigade shift register configuration of insulated gate field effect transistors. Such a shift register is described in more detail with reference to FIG. 4.

Figure 2:
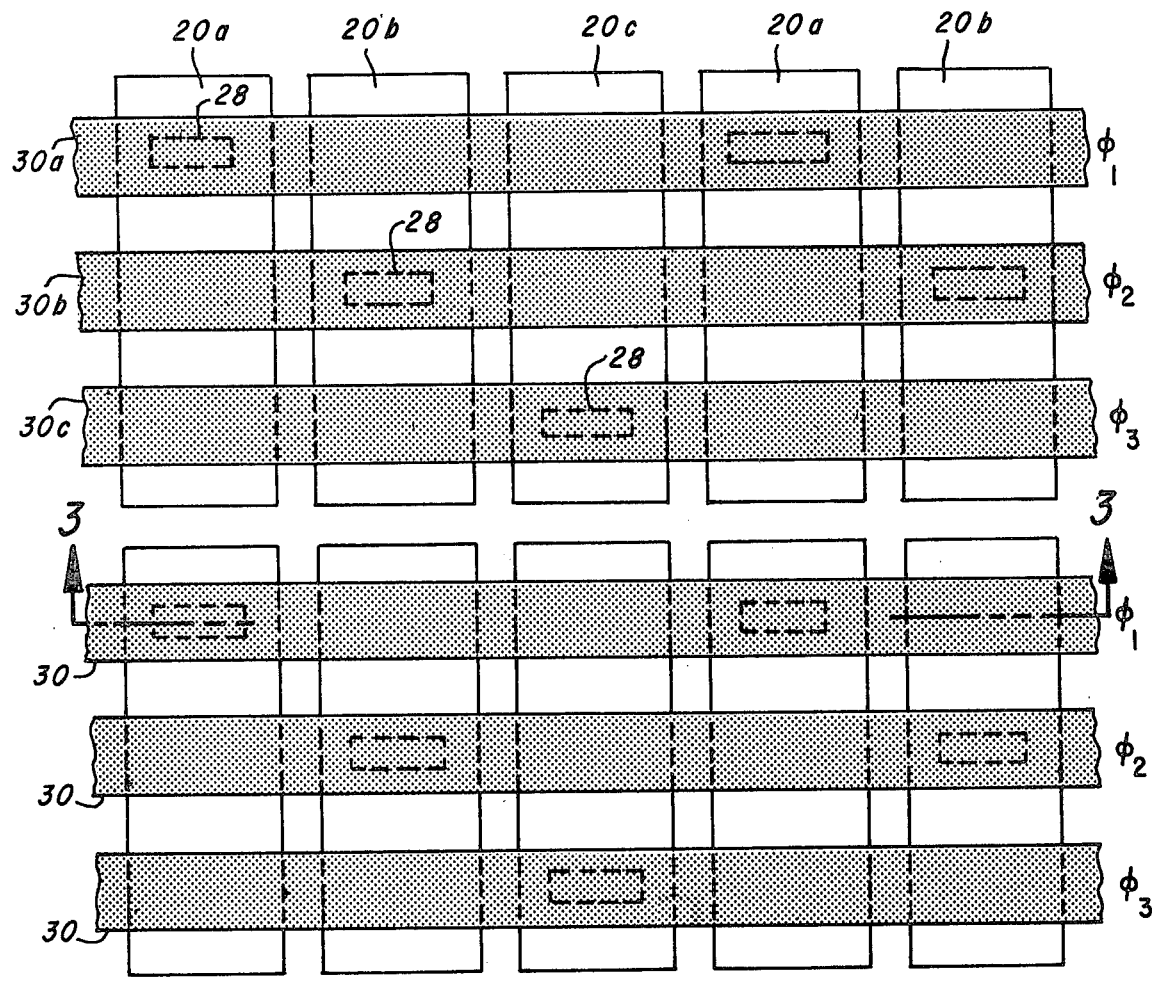
FIG. 2 is a plan view illustrating two rows of the imager illustrated in FIG. 1 showing the two-level metallization system of the present invention.

With reference to FIG. 2, portions of two rows of the imager screen 10 are illustrated. For the three-phase shift register embodiment illustrated, a set of three electrodes such as 20a, 20b, and 20c defines one bit of the charge coupled shift register and correspondingly, one resolution element of the imager. The electrodes 20a, 20b and 20c are formed on a semiconductor substrate 22 and are separated therefrom by a relatively thin insulating layer 24. Preferably the substrate is n-type silicon, and the insulating layer 24 is silicon oxide formed to a thickness of about 1,000 Å. Other insulating materials such as silicon nitride could also be used. Also other semiconductor materials may be utilized if desired. A first level metallization is formed over the insulating layer 24, and this level is patterned by conventional techniques such as photolithographic masking and etching to provide a plurality of elongated, spaced apart substantially parallel electrodes 20a, 20b, and 20c. These electrodes are then covered with a relatively thick insulating layer 26 which may, by way of example, comprise silicon oxide formed to a thickness on the order of 10,000 Å. Also the layer 26 may advantageously be formed of anodized aluminum. Techniques for anodizing aluminum to form insulating layers are described in more detail in co-pending application, Ser. No. 130,358, filed Apr. 1, 1971, by Dean R. Collins et al, entitled "Semiconductor Device and Method of Fabrication."

Apertures 28 are opened in the insulating layer 26 to expose selected ones of the electrodes 20a, 20b, and 20c. A second level of metallization is formed over the insulating layer 26 and extends through the apertures 28 into ohmic contact with the electrodes 20. Preferably this metallization comprises aluminum. This layer may be patterned to form substantially parallel conductive strips 30a, 30b, and 30c. These conductive strips lie in a direction substantially perpendicular to the length of the elongated electrodes 20a, 20b, and 20c, as may be seen most clearly in FIG. 2. The conductive strips 30a, 30b, and 30c form the leads for the multiphase clocks $\phi_1$, $\phi_2$, and $\phi_3$ for the three phase embodiment illustrated. As may be seen, for example, with reference to the conductive strip 30a to which the multiphase clock $\phi_1$ is applied, ohmic contact is made only to electrodes 20a through the apertures 28. Similarly with respect to the conductive strip 30b, ohmic contact is made only to electrodes 20b; while with respect to conductive strip 30c, ohmic contact is made to electrodes 20c. This structure advantageously reduces the surface area required of the substrate 22.

Using drive lines 30a, 30b, and 30c, dimensioned in accordance with design rules which require 0.4 mills for line width and 0.4 mills for spaces between metal lines, the minimum dimensions of one cell, i.e., resolution element, of the imager is 2.8 × 2.8 mills or 70 microns on a side, assuming that the horizontal spacing between charge coupled device electrodes such as 20a and 20b is approximately 0.1 mills. This enables a resolution on the order of 357 lines per inch.

The respective rows of the imager are read out horizontally in charge-coupled device shift register fashion via the application of appropriate drive voltages on the metal drive lines $\phi_1$, $\phi_2$, and $\phi_3$ which are ohmically connected through the apertures in the second level of insulation 26 to the charge-coupled device electrodes 20a, 20b and 20c. It may thus be seen that an imager is provided which does not require a storage section and which requires only two different sets of clocks; one set of clocks for the vertical scan generator 18 (FIG. 1), and another set of clocks for the horizontal charge-coupled device shift register.

Figure 4:
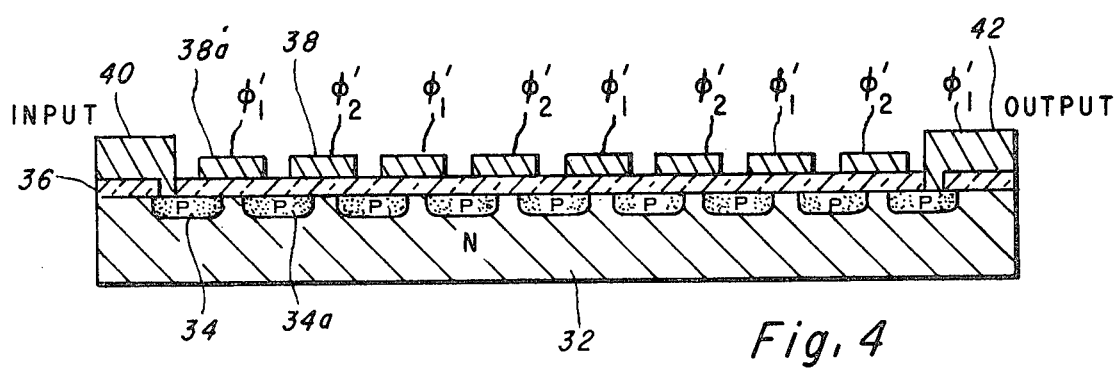
FIG. 4 is a cross section view of a bucket-brigade configuration of an insulated gate field effect transistors which may be utilized for the vertical scan shift register of FIG. 1.

With reference to FIG. 4, there is illustrated in cross section a bucket-brigade insulated gate field effect transistor shift register which may be utilized for the vertical scan shift register 18 of FIG. 1. By way of example, the shift register may be formed on an n-type silicon substrate 32. Pockets of opposite conductivity type material 34 respectively form the source and drain regions of the insulated gate field effect transistors. These pockets of opposite conductivity type may be formed by conventional techniques such as diffusion or ion implantation. A relatively thin insulating layer 36 of, for example, silicon dioxide having a thickness of about 1,000 Å is formed over the substrate 32 and pockets 34 of opposite conductivity type. Conductive electrodes 38 are formed over the insulating layer. As may be seen, the electrodes, such as 38a extend over a greater portion of the diffused region 34a than is normal in insulated gate field effect transistor devices. This is to enhance the miller capacitance and facilitate storage of charge in the bucket-brigade shift register. A two-phase clock shown generally as $\phi'_1$ and $\phi'_2$ is applied to successive gate electrodes of the bucket-brigade configuration. As understood by those skilled in the art, information in the form of electrical charge is generally stored only in every other bucket of the brigade. Input information to the shift register may be clocked in via the ohmic contact lead illustrated at 40, and information may be clocked out of the shift register via the ohmic contact lead 42.

Parallel taps to respective bits of the bucket-brigade shift register illustrated in FIG. 4 ohmically connect these bits to the gates of switching transistors such as 12, 14 and 16 illustrated in FIG. 1. This high impedance tap to the gate electrode of the insulated gate field effect transistor does not substantially affect the charge being shifted along the shift register. This tap may be effected by an ohmic contact to the diffused region such as 34a in FIG. 4.

While the two-level metallization system has been described above with respect to a three-phase system, it is to be understood that other multiphase charge-coupled shift register systems may be utilized. In addition, the electrodes themselves of the shift register may be formed in a two-level metallization technique such as described in the aforementioned U.S. Pat. No. 3,756,924 and a third metallization level utilized to connect to the respective electrodes as described in accordance with the present invention. Further while the illustrative embodiments have pertained to imagers, it will be appreciated that the multilevel metallization techniques may be utilized for a variety of applications requiring compact structures. Accordingly, it will be appreciated by those skilled in the art that various modifications may be made without departing from the scope or spirit of the invention.

What is claimed is:

1. An optical imager comprising a charge coupled device shift register defining a signal propagation path and including:
   (a) a semiconductor substrate having a first relatively thin insulating layer over one surface thereof;
   (b) a first level of conductors defining a plurality of elongated electrodes over said first insulating layer, said electrodes extending transversely of said signal propagation path and in spaced parallel relation with each other along said propagation path, the elongated electrodes included in said first level of conductors being arranged in at least two sets of phase electrodes wherein the respective electrodes included in the sets of phase electrodes are arranged consecutively to define a sequence of successive electrodes from each of the sets of phase electrodes;
   (c) a second relatively thick insulating layer over said first level of conductors defining a plurality of apertures selectively exposing portions of said elongated electrodes in a predetermined continuing staggered sequence related to the number of sets of phase electrodes;
   (d) a second level of conductors at a different level than said first level of conductors and defining a plurality of substantially parallel conductive strips overlying said second insulating layer and extending lengthwise of said signal propagation path with each of said plurality of conductive strips transversely overlying substantially all of said electrodes and positioned wholly within the length dimensions of said elongated electrodes, said conductive strips included in said second level of conductors being arranged in the same number of phase sets as the electrodes included in said first level of conductors, each of said conductive strips extending through apertures in said second relatively thick insulating layer and ohmically contacting only electrodes included in the set of phase electrodes to which the respective conductive strip corresponds; and
   (e) means for selectively applying individual phases of multiphase clocks to respective ones of said conductive strips.

2. An imager according to claim 1, wherein there are three sets of phase electrodes and phase conductive strips, there being three successive electrodes in each electrode sequence and three conductive strips overlying each of said electrodes, and wherein each set of phase electrodes comprises electrodes separated by two intervening electrodes of the other two sets of phase electrodes.

3. An imager according to claim 1, wherein said semiconductor substrate is a silicon substrate, said first and second insulating layers comprise silicon oxide, and said conductive strips comprise aluminum strips.

4. An imager according to claim 1, wherein said semiconductor substrate comprises a silicon substrate, said first insulating layer comprises silicon oxide, said first level of conductors comprises aluminum electrodes and said second insulating layer comprises aluminum oxide.

5. An optical imager comprising a plurality of charge coupled device shift registers defining a corresponding plurality of signal propagation paths extending parallel to each other, said charge coupled device shift registers comprising a common semiconductor substrate having a first relatively thin insulating layer over one surface thereof, each said charge coupled device shift register including:
   (a) a first level of conductors defining a plurality of elongated electrodes over said first insulating layer, said electrodes extending transversely of the signal propagation path of that shift register and spaced apart in parallel relation with each other along that said propagation path, the elongated electrodes included in said first level of conductors being arranged in at least two sets of phase electrodes wherein the respective electrodes included in the sets of phase electrodes are arranged consecutively to define a sequence of successive electrodes from each of the sets of phase electrodes;
   (b) a second relatively thick insulating layer over said first level of conductors of all of said shift registers and defining a plurality of apertures selectively exposing portions of said elongated electrodes in a predetermined continuing staggered sequence related to the number of sets of phase electrodes;
   (c) a second level of conductors at a different level than said first level of conductors and defining a plurality of substantially parallel conductive strips overlying said second insulating layer and extending lengthwise of said signal propagation paths with each of said plurality of conductive strips transversely overlying substantially all of said electrodes of the signal propagation path of that shift register and positioned wholly within the length dimensions of the elongated electrodes of that particular propagation path, said conductive strips included in said second level of conductors being arranged in the same number of phase sets as the electrodes included in said first level of conductors, each of said conductive strips extending through apertures in said second relatively thick insulating layer and ohmically contacting only electrodes included in the set of phase electrodes of that shift register to which the respective conductive strip corresponds;
   (d) means for selectively applying individual phases of multiphase clocks to respective ones of said plurality of conductive strips of each shift register; and
   (e) signal output means for each of said shift registers, and means connecting said output means to a common output for said imager.

* * * * *